United States Patent
Ikeda (10) Patent No.: US 9,698,746 B2
(45) Date of Patent: Jul. 4, 2017

(54) ACTIVE CONNECTOR HAVING LOOP THROUGH FUNCTION

(71) Applicant: Canare Electric Co., Ltd., Nisshin-shi, Aichi (JP)

(72) Inventor: Yasunari Ikeda, Yokohama (JP)

(73) Assignee: CANARE ELECTRIC CO., LTD., Aichi (JP)

( * ) Notice: Subject to any disclaimer, the term of this patent is extended or adjusted under 35 U.S.C. 154(b) by 56 days.

(21) Appl. No.: 14/440,185

(22) PCT Filed: Nov. 2, 2012

(86) PCT No.: PCT/JP2012/078533
§ 371 (c)(1),
(2) Date: May 1, 2015

(87) PCT Pub. No.: WO2014/068772
PCT Pub. Date: May 8, 2014

(65) Prior Publication Data
US 2015/0295555 A1 Oct. 15, 2015

(51) Int. Cl.
*H03H 7/38* (2006.01)
*H01R 24/42* (2011.01)
*H04B 3/04* (2006.01)
*H03H 7/48* (2006.01)
(Continued)

(52) U.S. Cl.
CPC ............... *H03H 7/38* (2013.01); *H01R 24/42* (2013.01); *H03H 7/48* (2013.01); *H04B 3/04* (2013.01); *H01R 13/6473* (2013.01); *H01R 13/719* (2013.01)

(58) Field of Classification Search
CPC . H03H 7/38; H03H 7/48; H01R 24/42; H01R 13/6473; H01R 13/719; H04B 3/04
See application file for complete search history.

(56) References Cited

FOREIGN PATENT DOCUMENTS

JP  8-316882 A  11/1996
JP  2000-308027 A  11/2000
(Continued)

*Primary Examiner* — Robert Pascal
*Assistant Examiner* — Kimberly Glenn
(74) *Attorney, Agent, or Firm* — Birch, Stewart, Kolasch & Birch, LLP (57) ABSTRACT

An object of the present invention is to realize a loop through circuit, in an active connector, securely having a preferable mismatching attenuation characteristic and having a preferable signal transmission characteristic, with respect to an input port, an output port, and an internal port, without providing a special circuit outside the connector. A connector base part has the input port inputting an external signal, the output port outputting a loop through signal, and the internal port outputting a signal into a device. First and second matching circuits, an equalizer circuit, a dividing circuit, and a driving circuit are stored in the connector base part. The matching circuit is supplied with an external signal input from the input port. The dividing circuit divides a signal to be input to generate first and second divided signals, and outputs them to the internal port and the output port. The equalizer circuit compensates for a frequency characteristic and/or loss of a signal to be input. The driving circuit is provided between the dividing circuit and the matching circuit, and drives a transmission line to be coupled to the output port.

10 Claims, 6 Drawing Sheets

(51) Int. Cl.
  *H01R 13/6473* (2011.01)
  *H01R 13/719* (2011.01)

(56) References Cited

FOREIGN PATENT DOCUMENTS

| | | |
|---|---|---|
| JP | 2003-59186 A | 2/2003 |
| JP | 2010-102910 A | 5/2010 |

ACTIVE CONNECTOR HAVING LOOP THROUGH FUNCTION

TECHNICAL FIELD

The present invention relates to an active connector, and, more particularly, to an active connector having a loop through function.

BACKGROUND ART

On the side of signal transmission, there is a demand for checking a video signal through a video monitor at the same time as transmitting the video signal, such as a television signal photographed by a camera. On the other hand, on the side of signal reception, there is a demand for performing various processes concurrently while checking the transmitted video signal through the video monitor. To satisfy these demands, it can be considered that a signal is divided into a plurality of signals and supplied to the devices, using a dividing device. In this configuration, a disadvantage is that the overall size of the configuration becomes large and that it lacks mobility. The device which has received the signal is equipped with a function (a loop through function) for looping through the received signal and externally outputting it.

Figure 7:
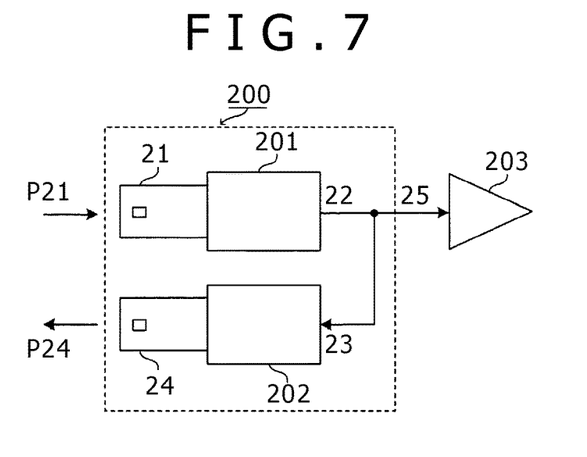
FIG. 7 is an exemplary diagram illustrating a configuration of a conventional loop through circuit.

As an example, as illustrated in FIG. 7, a conventional analog television monitor includes a loop through circuit configured using two connectors, inside the monitor, to realize a loop through function. That is, a loop through circuit 200 is configured with a connector 201, having a port 21 and a terminal 22, and a connector 202 having a port 24 and a terminal 23. It has a configuration in which the terminal 22 of the connector 201 and the terminal 23 of the connector 202 are shorted.

The loop through circuit 200 with this configuration introduces an external signal P21 input from the port 21 of the connector 201, into the device through the terminal 22 as a signal 25. The circuit 200 outputs a signal P24 with loop-through output from the port 24 through the terminal 23 of the connector 202, and supplies the signal to the device through the transmission line. The signal output from the terminal 25 of the loop through circuit 200 is supplied to a signal processing circuit 203 providing a high impedance input and being provided inside the device, and is introduced into the device for processing.

Figure 8:
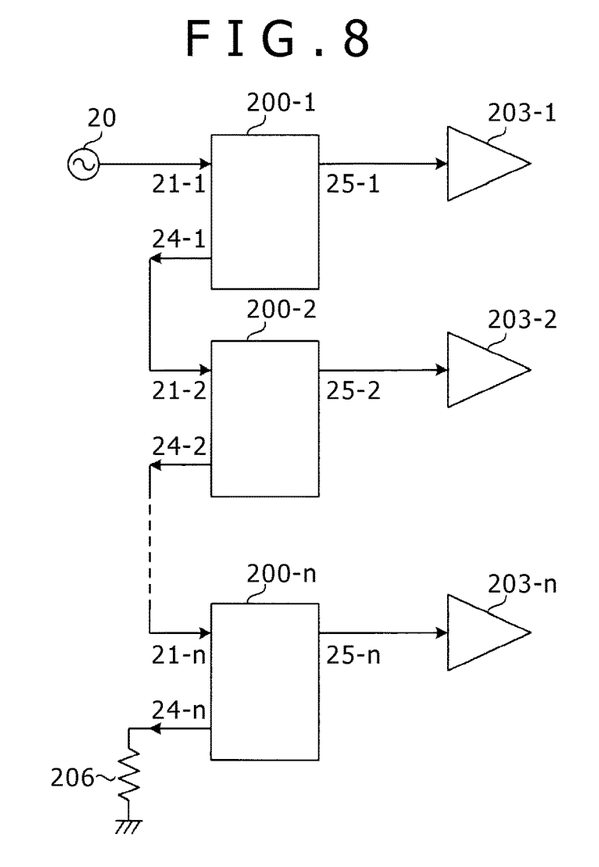
FIG. 8 is an exemplary diagram illustrating a configuration for connecting a device in multistage, using a conventional loop through circuit.

FIG. 8 illustrates an example of transmitting a signal to an "n" number of devices using this loop through circuit 200. The signal from an external signal source 20 is supplied to a port 21-1 of the loop through circuit 200-1 inside the device of the first stage, introduced into the device from a terminal 25-1, and also output from a port 24-1. The signal of this port 24-1 is input to a port 21-2 of the loop through circuit 200-2 of the device of the second stage, introduced into the device from a terminal 25-2, and output from a port 24-2. In this manner, the signal is sequentially transmitted, and the output of the port 24-n of the device of the "n"-th stage (as the final stage) is terminated by a terminating resistor 206. The signals introduced into the device from the terminals 25-1, 25-2, . . . 25-n of the stages are supplied to signal processing circuits 203-1, 203-2, . . . 203-n inside the devices. These signal processing circuits 203-1, 203-2, . . . 203-n provide a high impedance input, not to have an effect on the signal.

Figure 9:
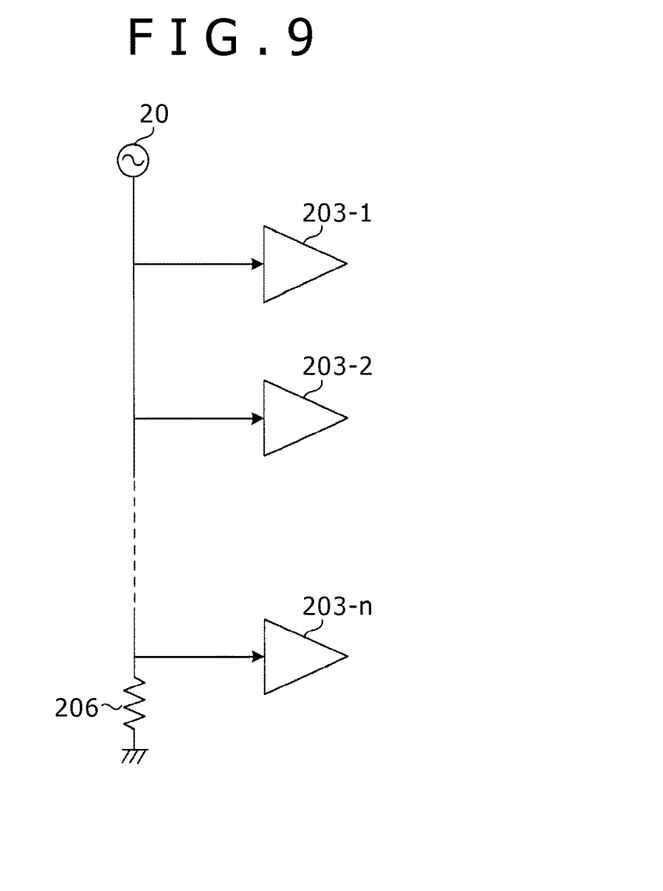
FIG. 9 illustrates an equalizer circuit for the loop through configuration illustrated in FIG. 8.

The loop through configuration of FIG. 8 can be expressed using an equivalent circuit of FIG. 9. That is, the signal from the external signal source 20 is transmitted to the terminating resistor 206 through the transmission line, and tapped out to the "n" number of devices, having a high impedance input and arranged in the middle of the transmission line.

However, the conventional method has a problem that the characteristic deteriorates due to an increase in reflection loss, because the recent digital television signal is a high speed/wide band pulse signal as compared with a conventional analog television signal. That is, according to the method using the loop through configuration of FIG. 8 to be an equivalent circuit of FIG. 9, the tap-out path from the middle of the transmission line will be a so-called stub. If the length of the stub is not negligible with respect to the signal wavelength, a negative effect is brought to the signal due to the reflection at the stub. For example, even if the length of the stub is negligible with respect to the analog signal of approximately 10 MHz, the length is not negligible with respect to a high speed/wide band pulse signal of several 100 MHz to several GHz, thus remarkably deteriorating the transmission characteristic. That is, as the signal bandwidth becomes wide, a relative length of the stub becomes longer as compared with the signal wavelength, resulting in deterioration of the transmission characteristic.

The present inventor has proposed an active connector (Patent Literature 1) which includes an equalizer circuit (for example, a cable equalizer), a buffer circuit (for example, cable driver) and the like in the connector base part, as a connector device that can be used easily by anybody without any special know-how, while obtaining a predetermined characteristic for the recent digital television signal. The above-described loop through circuit can be configured using this active connector. An example of this is illustrated in FIG. 10.

Figure 10:
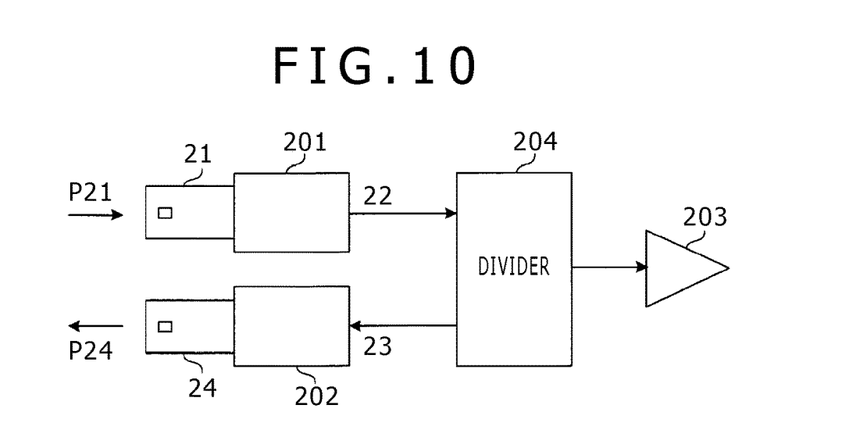
FIG. 10 is a block diagram illustrating a configuration example of a loop through circuit using the previously proposed active connector.

In FIG. 10, "201" identifies an active connector including a cable equalizer, and "202" identifies an active connector including a cable driver. "204" identifies a dividing circuit, and "203" identifies a signal processing circuit inside the device. The external signal P21 is supplied to the port 21 of the active connector 201, and output from the terminal 22 of the active connector 201. The output signal form the terminal 22 of the active connector 201 is supplied to the dividing circuit 204 arranged inside the device. An output of the dividing circuit 204 is supplied to the signal processing circuit 203 inside the device, while the other output thereof is supplied to the terminal 23 of the active connector 202 having the cable driver. Then, the signal P24 is output with loop-through output from the port 24 of the active connector 202.

As described in this example, when the conventional active connector is used, the dividing circuit 204 is necessarily arranged inside the device, in addition to the active connectors 201 and 202. However, because the dividing circuit 204 is provided on the outside of the connectors 201 and 202, the dividing circuit 204 and the connectors 201 and 202 are arranged consequently at a large physical distance therebetween. Thus, a problem is that there is an effect of mismatching between these active connectors 201 and 202 and the dividing circuit 204. For example, in the case of a signal having a transmission bandwidth up to 3 GHz, the wavelength in free space is approximately 100 mm, while the wavelength in a substrate whose relative permittivity is 4 to 5, like a glass epoxy substrate, is equal to or shorter than 50 mm. This implies that the distance of 5 mm on a substrate, for example, causes a phase shift of approximately 40°. That is, when the reflection occurs due to the impedance mismatching, the waveform is remarkably distorted.

To prevent or reduce this distortion, it is necessary to improve the accuracy of the impedance matching. However, parasitic elements in a high frequency circuit, which cause the mismatching, depend greatly on the wiring pattern or the circuit layout and also the experience of circuit designers or their know-how. In particular, the dividing circuit differs from a simple two-terminal circuit or four-terminal circuit, and is a circuit network of six terminals or more. Thus, it is very difficult to design the circuit excluding the effect of the mismatching. That is, even if the loop through circuit is configured using the active connector proposed by the present inventor, there is a disadvantage that the signal transmission characteristic remarkably depends on the wiring pattern or circuit layout of the dividing circuit, because the dividing circuit as terminal load is a six-terminal circuit network instead of a two-terminal circuit which the conventional active connector assumes.

CITATION LIST

Patent Literature

Patent Literature: Japanese Unexamined Patent Publication No. 2010-102910

SUMMARY OF INVENTION

Technical Problem

As described above, when a loop through circuit is arranged inside the device, in order to realize the loop through function in a device receiving the signal, the length of the stub with respect to a high speed/wide range external signal is not negligible. This may undesirably cause deterioration of the signal transmission characteristic. When the loop through circuit is configured using the proposed active connector and a known dividing circuit, the terminal load is a circuit having six terminals or more, which the conventional active connector does not assume. Therefore, the disadvantage is that the signal transmission characteristic remarkably depends on the circuit pattern.

It is accordingly an object of the present invention to realize a loop through circuit, in an active connector, securely having a preferable mismatching attenuation characteristic and having a preferable signal transmission characteristic, with respect to an input port, an output port, and an internal port, without providing a special circuit outside the connector.

It is also an object of the present invention to realize a loop through circuit, in an active connector, that can derive the preferable characteristics, even without the special know-how, in the usage.

It is also an object of the present invention to realize a loop through circuit that can enable downsizing of the device, in an active connector.

It is further an object of the present invention to enable switching between outputting an external signal with loop-through output and outputting a signal from the inside of the device, in an active connector.

Solution to Problem

In order to solve the above problem, the present invention provides an active connector which has a loop through function in itself. The active connector is applied to an input terminal of a device which receives an external signal. According to an aspect of the present invention, the active connector comprises a connector base part, first and second matching circuits, a dividing circuit, an equalizer circuit, and a driving circuit. The connector base part has a first connecting terminal to which an external signal is input, a second connecting terminal outputting a loop through signal, and a third connecting terminal outputting a signal into the device. The first and second matching circuits, the dividing circuit, the equalizer circuit, and the driving circuit are stored in the connector base part.

The first matching circuit is supplied with an external signal input from the first connecting terminal. The dividing circuit divides a signal to be input to generate first and second divided signals, outputs the first divided signal to the third connecting terminal, and outputs the second divided signal to the second connecting terminal. The equalizer circuit is provided between the first matching circuit and the dividing circuit, and compensates for a frequency characteristic and/or loss of the signal to be input. The second matching circuit supplies an output signal to the second connecting terminal. The driving circuit is provided between the dividing circuit and the second matching circuit, and drives a transmission line to be electrically coupled to the second connecting terminal.

According to another aspect of the present invention, an active connector comprises a connector base part, first and second matching circuits, a dividing circuit, an equalizer circuit, a multiplexer, and a driving circuit. The connector base part has a first connecting terminal to which an external signal is input, a second connecting terminal outputting a loop through signal, a third connecting terminal outputting a signal into the device, and a fourth connecting terminal to which an internal signal from an inside of the device is input. The first and second matching circuits, the dividing circuit, the equalizer circuit, the multiplexer, and the driving circuit are stored in the connector base part.

The first matching circuit is supplied with the external signal input from the first connecting terminal. The dividing circuit divides a signal to be input to generate first and second divided signals, outputs the first divided signal toward the third connecting terminal, and outputs the second divided signal toward the second connecting terminal. The equalizer circuit is provided between the first matching circuit and the dividing circuit, and compensates for a frequency characteristic and/or loss of a signal to be input. The multiplexer is supplied with the second divided signal from the dividing circuit and an internal signal input from the fourth connecting terminal. The multiplexer has a control terminal which switches between outputting one signal of the signals and outputting other signal thereof. The second matching circuit supplies an output signal to the second connecting terminal. The driving circuit is provided between the multiplexer and the second matching circuit, and drives a transmission line to be electrically coupled to the second connecting terminal.

In one embodiment of the active connector according to the present invention, the first and second connecting terminals may be an input port and an output port to be electrically coupled to a transmission line respectively, and the third and fourth connecting terminals may be input ports to be electrically coupled to a circuit inside the device.

In a preferred embodiment of the active connector according to the present invention, a division gain of the first divided signal in the dividing circuit may be configured to be greater than a division gain of the second divided signal.

In a preferred embodiment of the present invention, the driving circuit may drive the transmission line in accordance with the second divided signal supplied from the dividing circuit, to transmit the loop through signal.

Further in a preferred embodiment of the active connector according to the present invention, the equalizer circuit may further comprise an identification circuit which distinguishes a logic level of the input signal between "1" or "0", by comparing with a predetermined threshold value.

Advantageous Effects of Invention

The active connector according to the present invention comprises the equalizer circuit, the dividing circuit, and the driving circuit provided between the first matching circuit and the second matching circuit, in the connector base part. Thus, it is possible to realize a loop through circuit securely having a preferable mismatching attenuation characteristic and a preferable signal transmission characteristic, with respect to the input port, output port, and the internal port.

The active connector according to the present invention comprises the equalizer circuit, the dividing circuit, and the driving circuit provided between the first matching circuit and the second matching circuit, in the connector base part. Thus, the designers do not have to use the special know-how for improving the accuracy of the impedance matching, thus remarkably reducing the burden of circuit design. In addition, the equalizer circuit, the dividing circuit, and the driving circuit stored in the connector base part may be mounted physically or relatively at a short distance therebetween, thus enabling to downsize the device.

Moreover, when the active connector according to the present invention comprises the equalizer circuit, the dividing circuit, the multiplexer, and the driving, circuit that are provided between the first matching circuit and the second matching circuit, in the connector base part, it is possible to switch between outputting an external signal with loop-through output and outputting a signal from the inside of the device.

In a preferred embodiment of the active connector according to the present invention, in a configuration where a division gain of a first divided signal in the dividing circuit is larger than a division gain of a second divided signal, it is possible to output a signal securely having a desired level of a voltage amplitude. Therefore, inside the device, the introduced signal can stably be processed.

In a preferred embodiment of the active connector according to the present invention, in the driving circuit, if the transmission line is driven in accordance with the second division signal supplied from the dividing circuit, to transmit a loop-through signal, it is possible to transmit a loop-through signal securely having a desired level of voltage amplitude to the transmission line. Therefore, it is possible to improve the attenuation characteristic when two or more devices are loop-through connected through the transmission line.

In a preferred embodiment of the active connector according to the present invention, the equalizer circuit may further comprise an identification circuit which distinguishes the logic level of the input signal between "1" or "0", by comparing with a predetermined threshold value. Even when the input signal waveform deteriorates, and a detection error may occur in the logic level of the data as is, the circuit inside the device can be driven after data reproduction. Therefore, it is possible to introduce an accurate signal into the device and to perform the loop-through output.

The foregoing objects and advantages of the present invention and other objects and advantages thereof will become more readily understood from the following description of the preferred embodiments. The following descriptions of the preferred embodiments are provided by way of example only, and the present invention is not limited to these.

DESCRIPTION OF EMBODIMENTS

Preferred embodiments of an active connector according to the present invention will now specifically be described based on the drawings.

Figure 1:
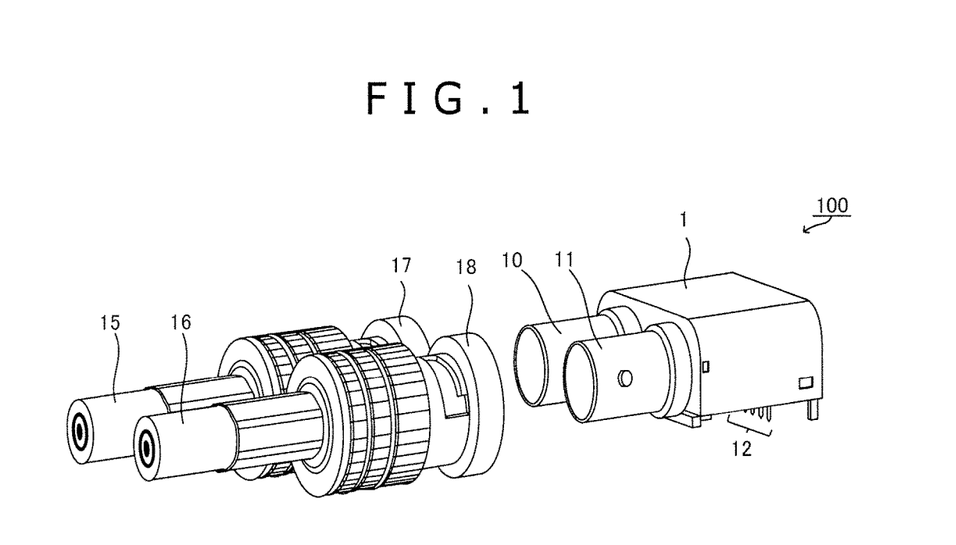
FIG. 1 is an external perspective diagram illustrating an example of an active connector with the present invention applied thereto.
Figure 2:
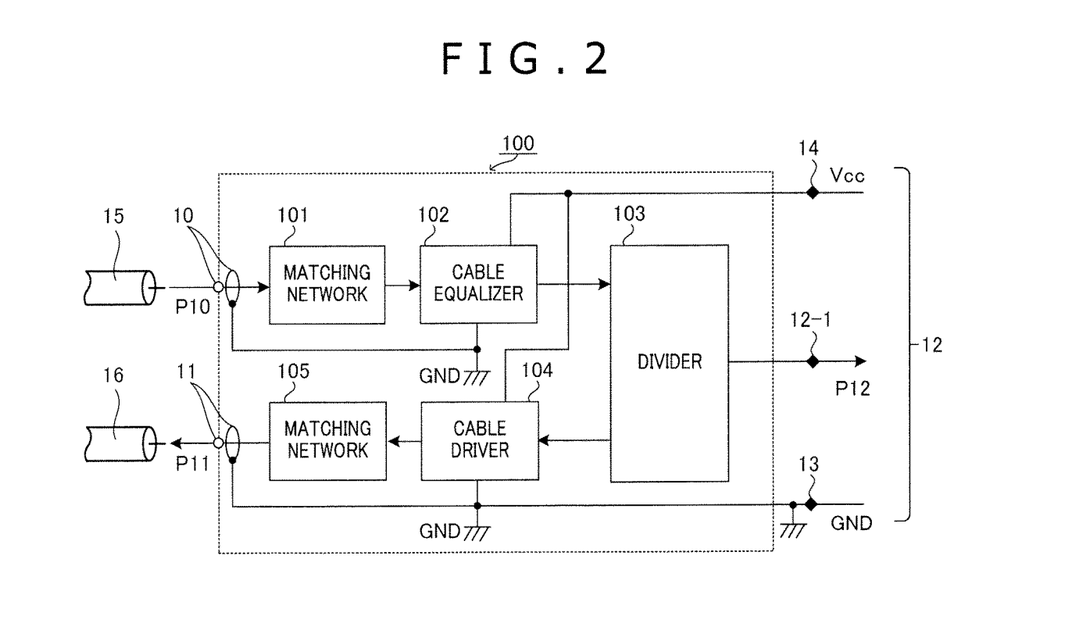
FIG. 2 is a block diagram illustrating a basic configuration of the active connector of a first embodiment according to the present invention.

FIG. 1 is an external perspective diagram illustrating an example of the active connector having the present invention applied thereto. FIG. 2 is a block diagram illustrating a basic configuration of one example, in the first embodiment of the active connector of the present invention. The active connector of this embodiment is an electric connector mounted on a substrate (not illustrated) provided in a device (not illustrated) receiving an external signal. Specifically, the present invention has been applied to a BNC type connector (hereinafter referred to as a BNC connector) for electrically coupling a 50Ω or 75Ω coaxial cable as a transmission line to the device.

An active connector 100 has a connector base part 1. The connector base part 1 has an input port 10, an output port 11, and an internal port 12. When the active connector 100 is attached to the device (not illustrated), the input port 10 and the output port 11 are provided and exposed from the casing of the device (not illustrated), for example, from the back panel, and respectively provide a port for inputting an external signal and a port for outputting a loop through signal. In this embodiment, the input port 10 and the output port 11 form a BNC jack or a receptacle projecting from one side surface of the connector base part 1. That is, the input port 10 and the output port 11 are attachable and detachable to and from BNC plugs 17, 18 which are electrically connected to one end of the coaxial cables as first and second transmission lines 15, 16. The input port 10 and the output port 11 respectively correspond to a first connecting terminal and a second connecting terminal of the present invention.

Next, the internal port 12 provides a port for introducing the external signal to a signal processing circuit (not illustrated) inside the device (not illustrated), and corresponds to a third connecting terminal of the present invention. Moreover, the internal port 12 is formed of a plurality of pins (terminal pins) projecting from the bottom part of the connector base part 1, and is electrically connected to the above-mentioned signal processing circuit (not illustrated). In the first embodiment, the active connector 100 includes an output terminal 12-1, a GND terminal 13, and a power supply terminal 14, as will be described later, as terminal pins for forming the internal port 12. Further, as in the second embodiment to be described later, the internal port 12 may include an internal signal input terminal 12-2 and a control terminal 12-3. They may be made in a pin-like form projecting from the bottom part of the connector base part 1.

FIG. 2 illustrates a basic configuration of the active connector in the first embodiment. With reference to FIG. 2, the active connector 100 according to the first embodiment includes first and second matching circuits 101 and 105, an equalizer circuit 102, a dividing circuit 103, and a driving circuit 104. These circuits are stored in the connector base part. The first matching circuit 101 is supplied with an external signal P10 input from the input port 10. The equalizer circuit 102 is, for example, a cable equalizer provided between the first matching circuit 101 and the dividing circuit 103, and compensates for frequency characteristics and/or loss of a signal to be input.

The dividing circuit 103 divides the signal to be input, generates first and second divided signals, outputs the first divided signal toward the internal port 12, and outputs the second divided signal toward the output port 11. The driving circuit 104 is, for example, a cable driver provided between the dividing circuit 103 and the second matching circuit 105, and drives the second transmission line 16 to be electrically coupled to the output port 11. The second matching circuit 105 supplies an output signal to the output port 11. The equalizer circuit 102 and the driving circuit 104 may include at least one active component, which is driven upon supply of a direct current voltage Vcc between the power supply terminal 14 and the GND terminal 13 from the power supply (not illustrated).

Descriptions will now be made to an operation of thus configured active connector. An external signal P10 is introduced to the active connector 100 through the input port 10. To introduce the external signal P10 to the connector, it is required that the distortion unlikely occurs and the loss of signal power is as little as possible. The first matching circuit 101 is an input matching circuit for performing impedance matching between the input-side, first transmission line 15 and the present connector, and performs impedance matching for a predetermined band, thereby preventing the loss of reflected power between the first transmission line 15 and the present connector and also preventing the waveform deterioration due to the reflection.

The signal via the first matching circuit 101 is supplied to the equalizer circuit (for example, cable equalizer) 102, and compensates for distortion due to the frequency characteristics along the transmission line. The length of the transmission line depends on the setting condition of the device, and the amount of distortion depends on the distance of the transmission line. The equalizer circuit 102 automatically compensates for the distortions depending on the transmission distance. Any signal whose frequency distortion has been compensated at the equalizer circuit 102 is supplied to the dividing circuit 103. The dividing circuit 103 divides this signal into two signals (first and second divided signals), and supplies them to the driving circuit (for example, cable driver) 104 and the internal port 12. The driving circuit 104 is a circuit for driving the second transmission line 16 to be electrically connected through an output port P11, and supplies the signal to the second matching circuit 105.

The second matching circuit 105 is an output matching circuit, performs impedance matching between the present connector and the output-side, second transmission line 16 like the first matching circuit 101, and is intended to decease the occurrence of distortion and loss of reflection as much as possible. The signal P10 introduced from the input port 10 is output as a loop through signal P11 from the output port 11, through the inside of the present connector. The other signal (first divided signal) output by the dividing circuit 103 is output directly to the internal port 12, and is supplied to the inside of the device as a signal P12 through the output terminal 12-1 of the internal port 12.

Figure 3:
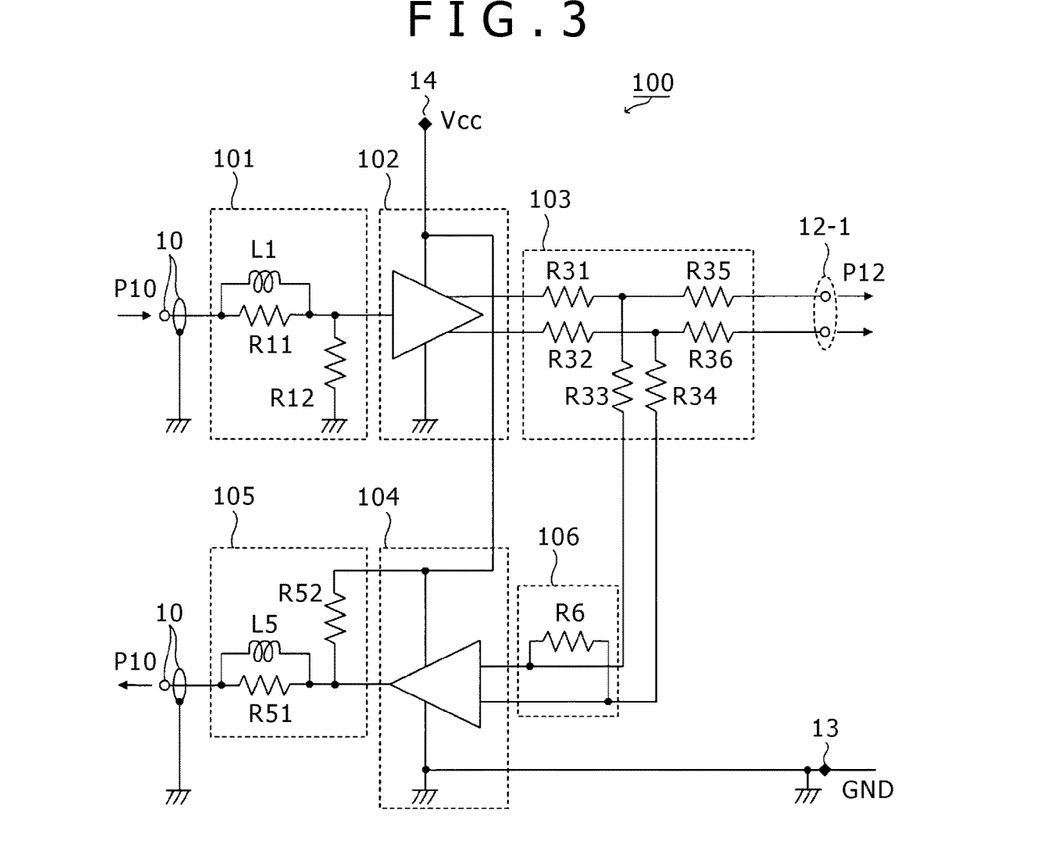
FIG. 3 is a circuit diagram of the active connector of the first embodiment illustrated in FIG. 2.

FIG. 3 is a circuit diagram of the active connector of the first embodiment in FIG. 2. Descriptions will be made under the assumption of an HD-SDI (High Definition Serial Digital Interface) signal as a bit serial signal sequence of an uncompressed HDTV signal, as generally used as an uncompressed digital HDTV signal.

The external signal P10 in the HD-SDI form and transmitted through the first transmission line (not illustrated) is input to the first matching circuit 101 via the input port 10 of the present connector 100. This first matching circuit 101 is preferably configured with an LR circuit having L1, R11, and R12. This is to cancel the mismatch loss due to parasitic capacitance C (as an element floating in each unit of the circuit) parasitizing especially in the equalizer circuit (for example, a cable equalizer) 102 arranged in the subsequent stage of the first matching circuit 101. Note that the first matching circuit 101 may be configured with an LRC circuit in some case.

The output of the first matching circuit 101 is supplied to the equalizer circuit 102, and the equalizer circuit 102 compensates for the distortion of the frequency characteristics depending on the length of the transmission line or the length of the cable. The equalizer circuit, for example, the equalizer itself is a circuit for compensating for the frequency characteristics, and is a circuit for processing an analog signal. However, in general, it is preferably binarized using an appropriate threshold value and output as a digital signal, after compensation of the frequency characteristics. That is, it is preferred that the equalizer circuit 102 further includes an identification circuit which distinguishes the logic level of the input signal between "1" or "0", by comparing it with a predetermined threshold value. With this configuration, even when an input signal waveform may be distorted, and a detection error may occur on the logic level of the data as is, the circuit inside the device can be driven after data reproduction, thus enabling to introduce a very accurate signal into the device and to perform loop through output.

A differential signal form, such as a LVDS (Low Voltage Differential Signaling) signal, may often be used, as a signal form in a case where a high speed/wide band digital signal (like HD-SDI signal) is output from a semiconductor integrated circuit. Even in this case, impedance matching is necessary, because the high speed/wide band signal is managed. In the case of an LVDS signal, it is necessary to have termination with the terminating resistor of a differential 100Ω. To realize a loop through function in the present connector, it is necessary to divide the output signal of the equalizer circuit 102 into two. However, the dividing circuit 103 needs to be designed in consideration of the impedance matching. The design of the dividing circuit 103 will specifically be described later. In the present invention, this dividing circuit 103 is configured inside the connector. Thus, it is possible to have a short distance between the equalizer circuit 102 and the dividing circuit 103 and a short distance between the dividing circuit 103 and the driving circuit 104.

In the present invention, it is possible to physically have a short distance, thus enabling to reduce the effect of the parasitic element generated on a path between circuits and to lower the length relative to the wavelength. This results in lowering the effect of reflection. As a result, the dividing circuit 103 may be a simple circuit with only resistors R31, R32, R33, R34, R35, and R36, as illustrated. Though the circuit is a simple circuit, it can realize preferable characteristics.

One output of the dividing circuit 103 with this configuration is output as a signal P12 into the device, through a pair of output terminals 12-1 of the internal port 12. The other output of the dividing circuit 103 is supplied to the driving circuit (for example, cable driver) 104 as a loop through path. A terminating resistor identified with R6 is a terminating resistor for the output from the dividing circuit 103 to the driving circuit 104. The driving circuit 104 is a circuit for causing the loop through signal P11 from the output port 11 to drive the transmission line, and is formed using a CML (Current Mode Logic) circuit in many cases. The CML circuit provides a high impedance output. Thus, especially, the parasitic capacitance will be the problem. Therefore, the second matching circuit 105 is a circuit for canceling mainly the parasitic capacitance, and is preferably formed using the LR circuit with those identified with L5, R51, and R52 in the illustration.

Figure 4:
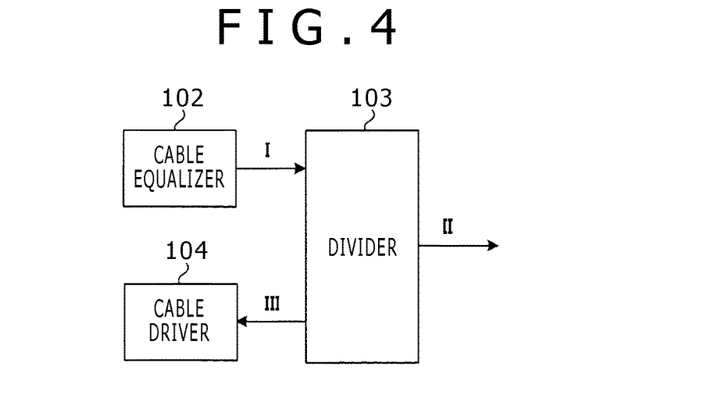
FIG. 4 is an exemplary diagram for explaining a dividing operation of a dividing circuit.

Descriptions will now be made to a dividing operation of the dividing circuit 103 using FIG. 4. In this case, "I" identifies a target input to be divided from an equalizer circuit (for example, cable equalizer) 102, "II" identifies a divided output for the internal port 12, and "III" identifies a divided output for the driving circuit (for example, cable driver) 104. On feature of signal division when the dividing circuit is configured with the resistance circuit network like illustrated in FIG. 3 is that the sum of a voltage division gain for the output "II" and a voltage division gain for the output "III" becomes 1. For example, when the division gain for the output "II" is 0.9, the division gain for the output "III" is 0.1.

The signal output from the internal port 12 is used inside the device as a signal from the connector. Inside the device, which signal processing circuit or which semiconductor device is used depends on the individual devices. Therefore, it is desirable that the level of the output signal (the input signal seen from the circuit inside the device) from the internal port 12 is as high as possible, thus a large division gain is demanded. On the contrary, the driving circuit 104 used in the loop through path inside the connector is a device that is definable by the designer, and its driving conditions are uniquely set based on the device. In general, the driving circuit 104 is designed to be highly sensitive to the input signal. If a certain level or higher of signal amplitude level is secured, it appropriately operates. Thus, there is no need to have a large division gain. From the above, the dividing circuit 103 can be designed to have different gains of the divided outputs.

Figure 5:
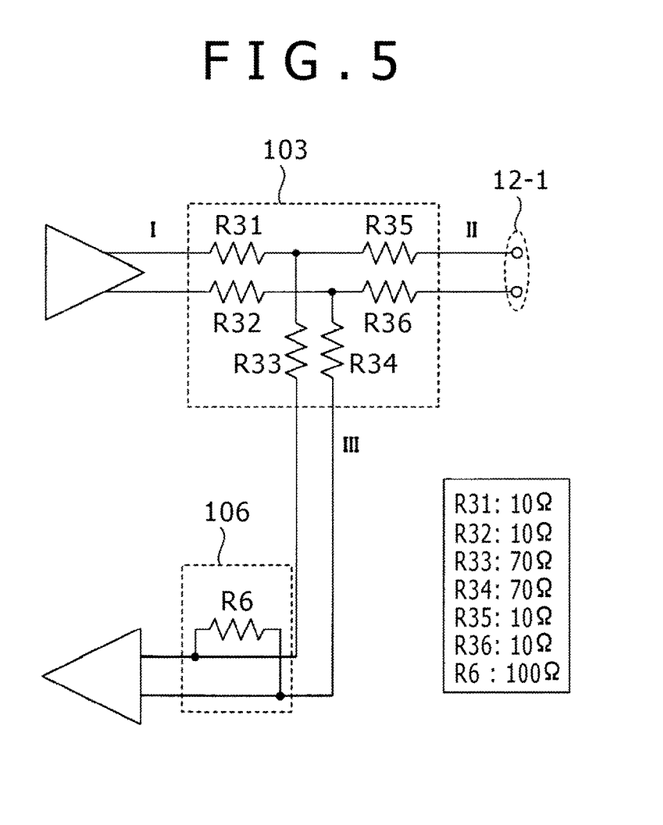
FIG. 5 is a circuit diagram illustrating a circuit example related to a dividing operation of the dividing circuit and having different divided outputs.

FIG. 5 illustrates a circuit example having different divided outputs. For successful impedance matching of 50Ω at the single end, as an LVDS signal, the resistors R31, R32, R35, and R36 in the dividing circuit 103 are 10Ω resistors, while the resistors R33 and R34 are 70Ω resistors. Note that the terminating resistor R6 is a 10Ω resistor. At this time, the divided output toward the internal port 12 is ⅔, while the divided output toward the driving circuit 104 is ⅓. In FIG. 5, the dividing circuit is configured using a so-called a T-type circuit, but may be configured using a π-type circuit.

Figure 6:
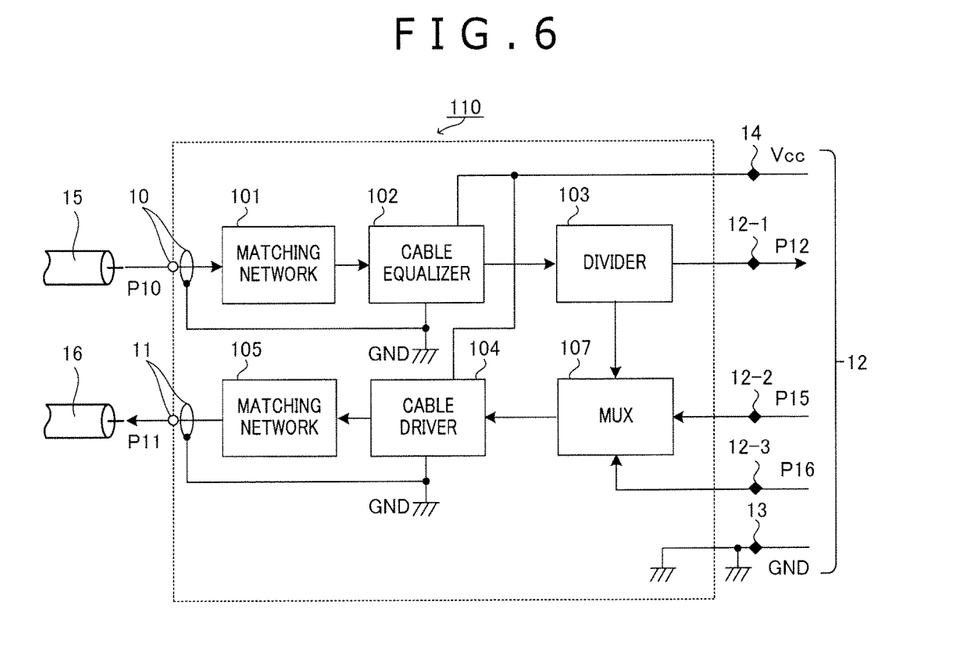
FIG. 6 is a block diagram illustrating a basic configuration of an active connector of a second embodiment according to the present invention.

Descriptions will now be made to an active connector according to a second embodiment of the present invention, with reference to FIG. 6. In FIG. 6, the same constituent parts as those of the active connector of the first embodiment in FIG. 2 are identified with the same reference numerals. In this embodiment, in an active connector 110 of FIG. 6, what differs from the active connector of FIG. 2 are that: it includes a multiplexer 107 inside; and switching control is possible as to whether the signal of the output port 11 is a loop through signal of the external signal P10 from the input port 10, or a signal based on the internal signal P15 supplied from the inside of the device through the internal signal input terminal 12-2. In FIG. 6, operations and functions of the input port 10, the output port 11, the internal port 12, the first matching circuit 101, the equalizer circuit (for example, cable equalizer) 102, the dividing circuit 103, the driving circuit (for example, cable driver) 104, and the second matching circuit 105 are the same as those of the active connector in FIG. 2, and will not be described again.

The multiplexer 107 is provided between the diving circuit 103 and the driving circuit 104, and is supplied with a second divided signal from the dividing circuit 103 and the internal signal P15 input from the internal signal input terminal 12-2. The internal signal input terminal 12-2 corresponds to a fourth connecting terminal of the present invention. The multiplexer 107 has the control terminal 12-3 which switches between outputting a looped-through signal of the external signal P10 from the input port 10 and outputting a signal based on the internal signal P15 supplied from the inside of the device through the internal signal input terminal 12-2. The internal signal input terminal 12-2 and the control terminal 12-3 are adjacent to the output terminal 12-1, the GND terminal 13, and the power supply terminal 14 included in the internal port 12, and may include pins projecting from the bottom part of the connector base part 1. These are connected to the circuit inside the device.

Descriptions will now be made to operations of the active connector according to the second embodiment. The external signal P10 is introduced to the present connector through the input port 10. The signal went through the first matching circuit 101 and the equalizer circuit 102 is supplied to the dividing circuit 103. The dividing circuit 103 divides this signal into two signals (first and second divided signals), and supplies the signals to the internal port 12 and the multiplexer 107 respectively. The signal P12 supplied to the internal port 12 is taken into the device through the output terminal 12-1. In this embodiment, to the multiplexer 107, the internal signal P15 is supplied from the inside of the device through the internal signal input terminal 12-2, as the other signal. The multiplexer 107 switches between the second divided signal (that is, an external signal) supplied from the dividing circuit 103 and the internal signal P15 supplied from the inside of the device through the internal signal input terminal 12-3, and supplies the signal to the driving circuit 104 of the next stage.

The switching operation of the multiplexer 107 is controlled in accordance with a control signal P16 from the inside of the device through the control terminal 12-3 of the internal port 12. The output of the multiplexer 107 goes through the driving circuit 104 and the second matching circuit 105 and drives the second transmission line 16 through the output port 11. Accordingly, the active connector 110 of this embodiment has a function for switching, inside the connector, between outputting, from the output port 11, the external signal introduced from the input port 10 after being looped through and outputting, from the output port 11, the internal signal introduced from the inside of the device through the internal signal input terminal 12-2 of the internal port 12, by using a control signal applied to the control terminal 12-3 of the internal port 12.

As described above, according to the present invention, it has the following advantages: (1) it is possible to realize a loop through circuit having a preferable signal transmission characteristic while obtaining a desirable mismatching attenuation characteristic with respect to the input port, the output port, and the internal port, without providing a special circuit outside the connector; and (2) the designers do not have to use the special know-how for improving the accuracy of the impedance matching, thus remarkably reducing the burden of circuit design. In addition, the equalizer circuit, the dividing circuit, and the driving circuit stored in the connector base part can be mounted physically and relatively at a short distance, thus enabling to downsize the device.

When the equalizer circuit, the dividing circuit, the multiplexer, and the driving circuit that are provided between the first matching circuit and the second matching circuit are included in the connector base part, there is another advantage that it is possible to switch between outputting the external signal as loop-through output and outputting the signal from the inside of the device.

In the above descriptions of the plurality of embodiments, as a specific example applicable to a physical interface for transmitting an HD-SDI signal, the descriptions have been made to the examples of applying the present invention to the BNC connector for coupling the coaxial cable as the transmission line and the device (a transmission device or the reception device). However, these are simply an example only, and the present invention is not limited to them. Needless to say, the present invention is applicable to physical interfaces of various standards for transmitting signals of other signal forms, that is, various forms of connectors that are used for input terminals of various devices (a broadcasting equipment, a video/audio equipment, a personal computer, a signal transmission terminal, a signal reception terminal, a relay device, and the like) that transmit the signals with using the transmission line of other forms.

INDUSTRIAL APPLICABILITY

The present invention is widely applicable to input terminals of various devices having a loop through function.

LIST OF REFERENCE SIGNS

1 Connector Base Part
10 Input Port (First Connecting Terminal)
11 Output Port (Second Connecting Terminal)
12 Internal Port (Third Connecting Terminal)
12-1 Output Terminal
12-2 Internal Signal Input Terminal (Fourth Connecting Terminal)
12-3 Control Terminal
13 GND Terminal
14 Power Supply Terminal
100, 110 Active Connector
101 First Matching Circuit
102 Equalizer Circuit
103 Dividing Circuit
104 Driving Circuit
105 Second Matching Circuit
106 Terminating Resistor
107 Multiplexer

What is claimed is:

1. An active connector applied to an input terminal of a device which receives an external signal via a first transmission line, comprising:
   a connector base part which has a first connecting terminal to which the external signal is input, a second connecting terminal outputting a loop through signal, and a third connecting terminal outputting a signal into the device;
   a first matching circuit to which the external signal is supplied from the first connecting terminal;
   an equalizer circuit which compensates for a frequency characteristic and/or loss of the external signal;
   a dividing circuit which divides the external signal to be input via the first matching circuit and the equalizer circuit to generate first and second divided signals, outputs the first divided signal to the third connecting terminal, and outputs the second divided signal toward the second connecting terminal;
   a second matching circuit which supplies an output signal to the second connecting terminal to which a second transmission line is electrically coupled; and
   a driving circuit which receives the second divided signal and drives the second transmission line to be electrically coupled to the second connecting terminal, and wherein
   the first and second matching circuits, the dividing circuit, the equalizer circuit, and the driving circuit are stored in the connector base part.

2. The active connector according to claim 1, wherein the first and second connecting terminals are an input port to which the first transmission line is electrically coupled and an output port to which the second transmission line is electrically coupled respectively, and the third connecting terminal is an internal port to be electrically coupled to a circuit inside the device.

3. The active connector according to claim 2, wherein a division gain of the first divided signal in the dividing circuit is configured to be greater than a division gain of the second divided signal.

4. The active connector according to claim 2, wherein the driving circuit drives the transmission line in accordance with the second divided signal supplied from the dividing circuit, to transmit the loop through signal.

5. The active connector according to claim 2, wherein the equalizer circuit further includes an identification circuit which distinguishes a logic level of the input signal between "1" or "0", by comparing with a predetermined threshold value.

6. An active connector applied to an input terminal of a device which receives an external signal via a first transmission line, comprising:
   a connector base part which has a first connecting terminal to which the external signal is input, a second connecting terminal outputting a loop through signal, a third connecting terminal outputting a signal into the device, and a fourth connecting terminal to which an internal signal from an inside of the device is input;
   a first matching circuit to which the external signal input from the first connecting terminal is supplied;

an equalizer circuit which compensates for a frequency characteristic and/or loss of the external signal;

a dividing circuit which divides the external signal to be input via the first matching circuit and the equalizer circuit to generate first and second divided signals, outputs the first divided signal toward the third connecting terminal, and outputs the second divided signal toward the second connecting terminal;

a multiplexer to which the second divided signal from the dividing circuit and an internal signal input from the fourth connecting terminal are supplied, and has a control terminal which switches between outputting the second divided signal and outputting the internal signal;

a second matching circuit which supplies an output signal to the second connecting terminal to which a second transmission line is electrically coupled; and a driving circuit which receives the second divided signal and drives the second transmission line, and wherein the first and second matching circuits, the dividing circuit, the equalizer circuit, the multiplexer, and the driving circuit are stored in the connector base part.

7. The active connector according to claim 6, wherein
the first and second connecting terminals are an input port to which the first transmission line is electrically coupled and an output port to which the second transmission line is electrically coupled respectively, and the third and fourth connecting terminals internal ports to be electrically coupled to a circuit inside the device.

8. The active connector according to claim 7, wherein
a division gain of the first divided signal in the dividing circuit is configured to be greater than a division gain of the second divided signal.

9. The active connector according to claim 7, wherein
the driving circuit drives the transmission line in accordance with the second divided signal or an internal signal input from the fourth connecting terminal, to transmit the loop through signal.

10. The active connector according to claim 7, wherein
the equalizer circuit further includes an identification circuit which distinguishes a logic level of the input signal between "1" or "0", by comparing with a predetermined threshold value.

* * * * *